United States Patent
Kanno et al.

(10) Patent No.: US 11,201,050 B2
(45) Date of Patent: Dec. 14, 2021

(54) SUBSTRATE PROCESSING METHOD, RECORDING MEDIUM AND SUBSTRATE PROCESSING APPARATUS

(71) Applicant: Tokyo Electron Limited, Tokyo (JP)

(72) Inventors: Itaru Kanno, Tokyo (JP); Hiromi Kiyose, Hillsboro, OR (US); Gentaro Goshi, Koshi (JP); Naohiko Hamamura, Koshi (JP); Takuro Masuzumi, Koshi (JP); Kenji Sekiguchi, Koshi (JP); Satoru Tanaka, Koshi (JP); Teruomi Minami, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 92 days.

(21) Appl. No.: 16/411,404

(22) Filed: May 14, 2019

(65) Prior Publication Data
US 2019/0355574 A1 Nov. 21, 2019

(30) Foreign Application Priority Data

May 15, 2018 (JP) .............................. JP2018-093964
Mar. 28, 2019 (JP) .............................. JP2019-064742

(51) Int. Cl.
*F26B 3/34* (2006.01)
*H01L 21/02* (2006.01)
*F26B 3/28* (2006.01)
*H01L 21/67* (2006.01)

(52) U.S. Cl.
CPC .......... *H01L 21/02101* (2013.01); *F26B 3/28* (2013.01); *H01L 21/67034* (2013.01)

(58) Field of Classification Search
CPC ......... H01L 21/02101; H01L 21/02057; H01L 21/67028; H01L 21/67017; H01L 21/67103; H01L 21/67115; H01L 21/67178; F26B 3/28
USPC ............................................ 34/266–269, 275
See application file for complete search history.

(56) References Cited

U.S. PATENT DOCUMENTS

| | | | |
|---|---|---|---|
| 2012/0231397 A1* | 9/2012 | Le Claire | G03F 1/82 430/320 |
| 2013/0019905 A1* | 1/2013 | Ji | H01L 21/02057 134/30 |
| 2014/0144462 A1* | 5/2014 | Verhaverbeke | H01L 21/67051 134/1.2 |
| 2016/0334162 A1* | 11/2016 | Kim | H01L 21/67051 |
| 2017/0098555 A1* | 4/2017 | Gouk | B08B 7/0035 |

FOREIGN PATENT DOCUMENTS

JP 2013-179244 A 9/2013

* cited by examiner

*Primary Examiner* — John P McCormack
(74) *Attorney, Agent, or Firm* — Pearne & Gordon LLP

(57) ABSTRACT

A substrate processing method capable of suppressing particles from remaining on a surface of a substrate is provided. In the substrate processing method, a liquid film of a protection liquid is formed on the surface of the substrate, and the substrate is dried by using a supercritical fluid so that the protection liquid is removed from the surface of the substrate. After the substrate is dried, the particles remaining on the surface of the substrate is removed.

14 Claims, 10 Drawing Sheets

SUBSTRATE PROCESSING METHOD, RECORDING MEDIUM AND SUBSTRATE PROCESSING APPARATUS

CROSS-REFERENCE TO RELATED APPLICATION

This application claims the benefit of Japanese Patent Application Nos. 2018-093964 and 2019-064742 filed on May 15, 2018 and Mar. 28, 2019, respectively, the entire disclosures of which are incorporated herein by reference.

TECHNICAL FIELD

The various aspects and embodiments described herein pertain generally to a substrate processing method, a recording medium and a substrate processing apparatus.

BACKGROUND

In the manufacture of a semiconductor device, a liquid processing such as chemical cleaning or wet etching is performed on a substrate such as a semiconductor wafer. After the liquid processing, the substrate is dried, and a liquid remaining on a surface of the substrate is removed. As a pattern formed on the surface of the substrate is miniaturized and has a high aspect ratio, a collapse of the pattern may easily occur in this substrate drying process. To cope with this problem, a drying method using a processing fluid in a supercritical state (for example, supercritical $CO_2$) has been recently used (see, for example, Patent Document 1).

The liquid processing and the supercritical drying processing are performed in different processing units. An example flow of these processings will be described. First, a chemical liquid processing, a pure water rinsing processing and a protection liquid replacement processing are performed in sequence within a liquid processing unit. By way of example, IPA (Isopropyl Alcohol) as an organic solvent is used as the protection liquid, and a liquid film (puddle) of the protection liquid is formed on the entire surface of the substrate. Then, the substrate having the liquid film formed thereon is transferred from the liquid processing unit into a supercritical drying processing unit, and the supercritical drying processing is then performed on the substrate within the supercritical drying processing unit.

During a period until the protection liquid is replaced by the supercritical fluid within the supercritical drying processing unit after the liquid film of the protection liquid is formed on the substrate within the liquid processing unit, the protection liquid becomes volatilized. If the liquid film of the protection liquid within a recess of the pattern on the surface of the substrate is removed due to this volatilization of the protection liquid, the collapse of the pattern may occur. To suppress this problem, the liquid film of the protection liquid formed within the liquid processing unit is set to have an enough thickness to suppress the removal of the liquid film during the aforementioned period.

After the protection liquid on the surface of the substrate is dried through the supercritical drying processing, however, fine particles may remain on the surface of the substrate. Thus, it is required to further suppress the remaining of the particles.

Patent Document 1: Japanese Patent Laid-open Publication No. 2013-179244

SUMMARY

In view of the foregoing, exemplary embodiments provide a substrate processing method, a recording medium and a substrate processing apparatus capable of suppressing particles from remaining on a surface of a substrate.

In one exemplary embodiment, a substrate processing method includes forming a liquid film of a protection liquid on a surface of a substrate; drying, by using a supercritical fluid, the substrate to remove the protection liquid from the surface of the substrate; and removing a particle remaining on the surface of the substrate after the drying of the substrate.

In another exemplary embodiment, there is provided a computer-readable recording medium having stored thereon computer-executable instructions that, in response to execution, cause a substrate processing apparatus to perform the substrate processing method.

In still another exemplary embodiment, a substrate processing apparatus includes a liquid film forming device configured to form a liquid film of a protection liquid on a surface of a substrate; a drying processing device configured to dry the substrate by using a supercritical fluid to remove the protection liquid from the surface of the substrate; and a particle processing device configured to remove a particle remaining on the surface of the substrate in the drying processing device.

According to the exemplary embodiments as stated above, it is possible to suppress the particles from remaining on the surface of the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
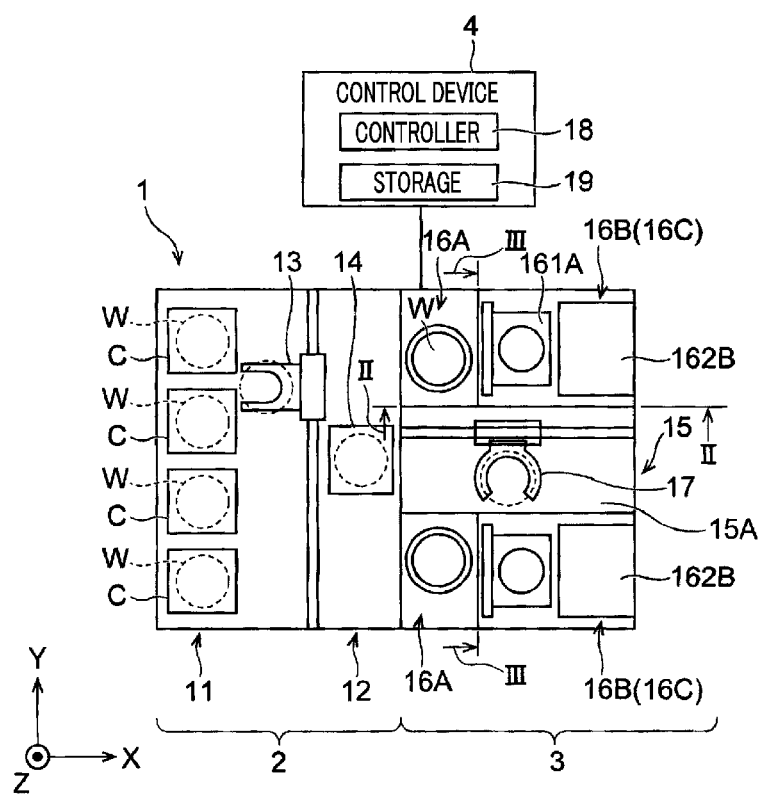
FIG. 1 is a schematic plan view of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings.

First, referring to FIG. 1 to FIG. 5E, an exemplary embodiment will be described. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 (substrate processing apparatus) includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

Figure 2:
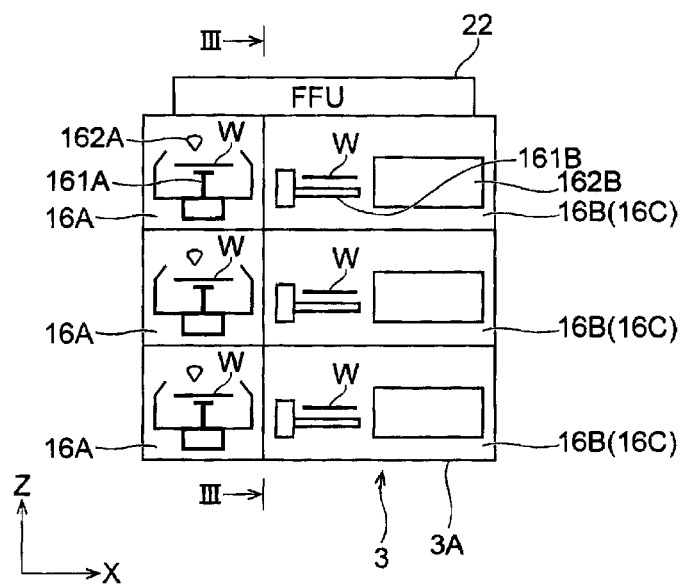
FIG. 2 is a schematic side view of a processing station of the substrate processing system taken along a line II-II of FIG. 1.
Figure 3:
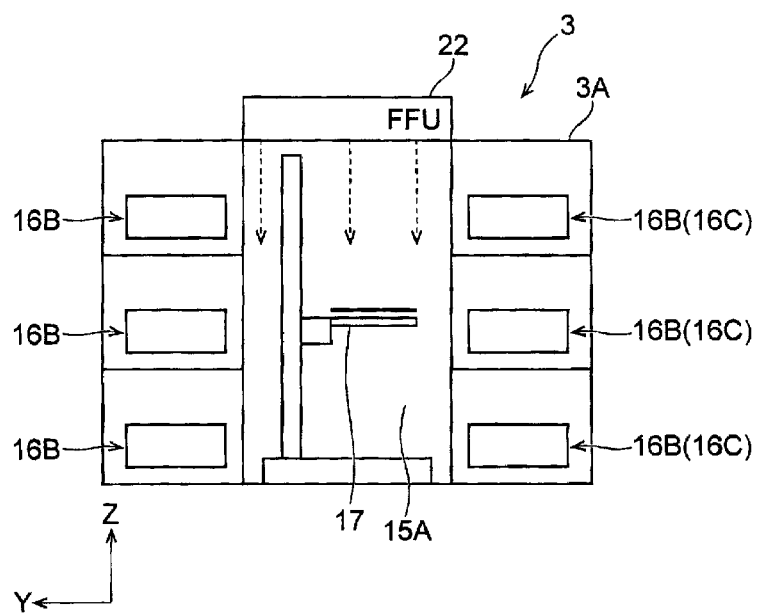
FIG. 3 is a schematic front view of the processing station of the substrate processing system taken along a line III-III of FIG. 1.

The processing station 3 is provided adjacent to the transfer section 12. As depicted in FIG. 1 to FIG. 3, the processing station 3 is equipped with a transfer section 15, a plurality of liquid processing units 16A (liquid film forming devices), a plurality of supercritical drying processing units 16B (drying processing devices) and a plurality of particle processing units 16C (particle processing devices).

Each liquid processing unit 16A is configured to perform a preset liquid processing (a chemical liquid cleaning processing, a wet etching processing, or the like) on the substrate. By way of example, as depicted in FIG. 2, the liquid processing unit 16A is equipped with: a spin chuck 161A configured to hold a wafer W horizontally and rotate the wafer W around a vertical axis; and one or more nozzles 162A configured to supply a processing liquid (a chemical liquid, a rinse liquid, a protection liquid (e.g., IPA), or the like) onto the wafer W. The configuration of the liquid processing unit 16A is not limited thereto, and any of various configurations may be adopted as long as a liquid film of the protection liquid having a required thickness can be formed on a surface of the wafer W.

Each supercritical drying processing unit 16B is configured to dry the wafer W by supplying a supercritical fluid (for example, supercritical $CO_2$) onto the wafer W on the surface of which the liquid film of the protection liquid for anti-drying is formed. By way of example, as shown in FIG. 2, the supercritical drying processing unit 16B is equipped with: a tray 161B configured to hold the wafer W horizontally; and a drying processing chamber 162B configured to accommodate therein the tray 161B in a sealed state.

Figure 4:
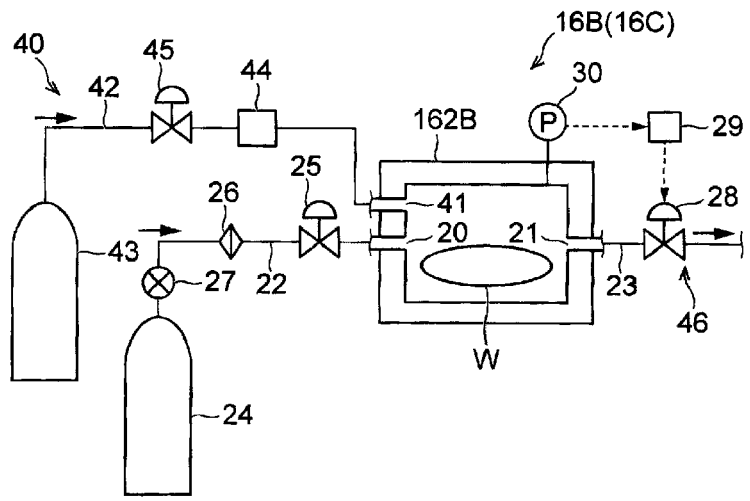
FIG. 4 is a diagram illustrating a system in a supercritical drying processing unit of FIG. 1.

As illustrated in FIG. 4, the drying processing chamber 162B is equipped with: a supercritical fluid supply port 20 configured to supply the supercritical fluid into the drying processing chamber 162B; and a drain port 21 through which a fluid is drained from the drying processing chamber 162B. The supercritical fluid supply port 20 is connected with a supercritical fluid supply line 22 through which the supercritical fluid is supplied into the drying processing chamber 162B. The drain port 21 is connected with a drain line 23 through which the fluid within the drying processing chamber 162B is drained.

The supercritical fluid supply line 22 is connected to a supercritical fluid supply tank 24. The supercritical fluid supply tank 24 is equipped with: a $CO_2$ bomb storing therein liquid $CO_2$ for example; and a booster pump composed of a syringe pump or a diaphragm pump and configured to increase a pressure of the liquid $CO_2$ supplied from the $CO_2$ bomb to allow the liquid $CO_2$ to be turned into a supercritical state. In FIG. 4, the $CO_2$ bomb and the booster pump are illustrated as a bomb shape as a whole.

The supercritical fluid supply line 22 is provided with an opening/closing valve 25, a filter 26 and a flow rate control valve 27. Among these, the opening/closing valve 25 is configured to be opened or closed depending on a supply and a stop of the supply of the supercritical fluid into the drying processing chamber 162B. The filter 26 is configured to remove a particle included in the supercritical fluid supplied from the supercritical fluid supply tank 24. The flow rate control valve 27 is configured to adjust a flow rate of the supercritical fluid which is supplied from the supercritical fluid supply tank 24 into the drying processing chamber 162B. The flow rate control valve 27 is composed of, by way of example, a needle valve and may also be configured to serve as a blocking member configured to block the supply of the supercritical $CO_2$ from the supercritical fluid supply tank 24.

The drain line 23 is provided with a decompression valve 28. This decompression valve 28 is connected to a pressure controller 29, and this pressure controller 29 has a feedback control function of adjusting a degree of openness thereof based on a result of comparison between a measurement result of a pressure within the drying processing chamber 162B obtained from a pressure gauge 30 provided in the drying processing chamber 162B and a predetermined set pressure.

As an example of the supercritical drying processing unit 16B, the one disclosed in Japanese Patent Laid-open Publication No. 2013-012538 according to a patent application filed by the present applicant may be used, but not limited thereto.

As shown in FIG. 1 and FIG. 3, the transfer section 15 has a transfer space 15A extended in the X direction, and a substrate transfer device (transfer mechanism) 17 is provided in this transfer space 15A. The multiple (three in the shown example) liquid processing units 16A are stacked in a vertical direction (Z-direction) at a left side (positive Y-direction) of the transfer space 15A, and the multiple (three in the shown example) liquid processing units 16A are stacked at a right side (negative Y-direction) of the transfer space 15A to face the liquid processing units 16A at the left side in the Y-direction. As shown in FIG. 1 to FIG. 3, the multiple (three in the shown example) supercritical drying processing units 16B are stacked in the vertical direction (Z-direction) at the left side (positive Y-direction) of the transfer space 15A and at the rear (positive X-direction) of the liquid processing units 16A. Further, the multiple (three in the shown example) supercritical drying processing units 16B are stacked at the right side (negative Y-direction) of the transfer space 15A and at the rear of the liquid processing units 16A (positive X-direction) to face the supercritical drying processing units 16B at the left side in the Y-direction.

The substrate transfer device 17 is equipped with a wafer holding mechanism configured to hold the wafer W. Further, the substrate transfer device 17 is configured to be movable horizontally and vertically and pivotable around a vertical axis. The wafer holding mechanism of the substrate transfer device 17 is accessible to the delivery unit 14, all the liquid processing units 16A and all the supercritical drying processing units 16B, and is configured to transfer the wafer W between these respective units 14, 16A and 16B.

As depicted in FIG. 3, the processing station 3 of the substrate processing system 1 includes a housing 3A. The liquid processing units 16A, the supercritical drying processing units 16B and the substrate transfer device 17 are accommodated in the housing 3A. Formed within the processing station 3 is the transfer space 15A which is surrounded by a ceiling plate and a bottom plate of the housing 3A and casings of the liquid processing units 16A and the supercritical drying processing units 16B. The wafer W is transferred in this transfer space 15A by the substrate transfer device 17.

A fan filter unit (FFU) 22 is provided on a ceiling of the housing 3A. The FFU 22 is provided to cover the substantially entire transfer space 15A from above. The FFU 22 is configured to supply a clean gas (in the present exemplary embodiment, clean air including air within a clean room which is filtered by a filter) downwards within the transfer space 15A. That is, a flow (downflow) of the clean air flowing downwards is formed within the transfer space 15A.

As depicted in FIG. 1, the substrate processing system 1 is equipped with a control device 4. The control device 4 is, for example, a computer, and includes a controller 18 and a storage 19. The storage 19 stores programs which control various processings performed in the substrate processing system 1. The controller 18 controls operations of the substrate processing system 1 by reading and executing the programs stored in the storage 19.

Further, the programs may be recorded in a computer-readable recording medium, and installed from the recording medium to the storage 19 of the control device 4. The computer-readable recording medium may be, for example, a hard disc (HD), a flexible disc (FD), a compact disc (CD), a magnet optical disc (MO), or a memory card.

Each particle processing unit 16C in the present exemplary embodiment is configured to remove particles P remaining on the surface of the wafer W by heating the wafer W dried in the supercritical drying processing unit 16B or by irradiating an ultraviolet ray to the wafer W. The supercritical drying processing unit 16B in the present exemplary embodiment is configured to serve as such a particle processing unit 16C.

The supercritical drying processing unit 16B in the present exemplary embodiment is configured to accommodate the wafer W after being dried in the drying processing chamber 162B and remove the particles remaining on the surface of the wafer W by heating the wafer W. In the present exemplary embodiment, the wafer W is heated as a high-temperature gas is supplied into the drying processing chamber 162B. That is, a gas supplier 40 is connected to the drying processing chamber 162B to supply the high-temperature gas into the drying processing chamber 162B. To be more specific, the drying processing chamber 162B is provided with a gas supply port 41 through which the high-temperature gas is supplied into the drying processing chamber 162B. The gas supplier 40 is connected to this gas supply port 41. The gas supplier 40 includes a gas supply line 42, a gas supply tank 43 and a gas heater 44.

The gas supply line 42 is connected to the gas supply port 41. The aforementioned gas supply tank 43 is connected to this gas supply line 42. The gas supply tank 43 stores a purge gas therein. In FIG. 4, though the gas supply tank 43 is shown to have a bomb shape, the gas supply tank 43 may not be limited to being formed of the bomb.

The gas supply line 42 is equipped with an opening/closing valve 45 and the aforementioned gas heater 44. The opening/closing valve 45 is configured to be opened or closed depending on a supply and a stop of the supply of the high-temperature gas into the drying processing chamber 162B (or the purge gas into the gas heater 44). The gas heater 44 is configured to heat the purge gas passing through the gas supply line 42 by a resistance heating element such as, but not limited to, a heater. The purge gas heated in the gas heater 44 is supplied into the drying processing chamber 162B as the high-temperature gas.

A temperature of the high-temperature gas supplied into the drying processing chamber 162B is higher than a temperature of the wafer W (or a temperature within the drying processing chamber 162B) obtained in a drying process of the wafer W. By way of example, the temperature of the high-temperature gas may be set to be equal to or higher than 80° C., and, desirably, equal to or higher than 100° C. Here, the temperature within the drying processing chamber 162B in the drying process may be set to be less than a boiling point of the protection liquid. Through this setting, it is possible to suppress a pattern collapse that might be caused as the protection liquid is volatilized from the surface of the wafer W before the inside of the drying processing chamber 162B is turned into the supercritical state. For example, in case that the protection liquid is IPA, the temperature within the drying processing chamber 162B in the drying process may be set to be less than 80° C. in consideration of the boiling point of the IPA at the atmospheric pressure which is 82.4° C. Thus, it is desirable that the high-temperature gas is set to have a temperature (e.g., 80° C.) higher than the temperature within the drying processing chamber 162B. The temperature within the drying processing chamber 162B may be controlled by a non-illustrated heater provided within the drying processing chamber 162B. Further, the high-temperature gas (or the purge gas) may be a dry air or an inert gas (for example, a nitrogen gas). Here, the dry air implies air which does not substantially contain moisture and from which moisture is removed to the extent that a characteristic of a device formed by the pattern formed on the surface of the wafer W is not degraded.

The high-temperature gas within the drying processing chamber 162B is exhausted through the drain line 23 via the drain port 21 which is provided at the drying processing chamber 162B. That is, in the present exemplary embodiment, the drain line 23 and the decompression valve 28 constitute a gas exhaust device 46 configured to exhaust the high-temperature gas from the drying processing chamber 162B. However, in addition to the drain line 23, a gas exhaust device 46 configured to exhaust the high-temperature gas (for example, a gas exhaust line of a system different from that of the drain line 23) may be connected to the drying processing chamber 162B.

A substrate processing method performed in the substrate processing system 1 having the above-described configuration will be explained.

First, as a carry-in process, a wafer W is carried into the liquid processing unit 16A. The substrate transfer device 13 of the carry-in/out station 2 first takes out the wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3, and then carried into the liquid processing unit 16A.

Then, as a liquid processing process, the wafer W is liquid-processed. In this case, the wafer W carried into the liquid processing unit 16A is rotated around the vertical axis while being held horizontally by the spin chuck 161A. Then, a chemical liquid is supplied from the nozzle 162A onto a central portion of a surface of the wafer W being rotated, and a chemical liquid processing is performed on the wafer W. Then, a rinse liquid (e.g., pure water) is supplied from the nozzle 162A onto the central portion of the surface of the wafer W, and a rinsing processing is performed on the wafer W. Further, the liquid processing performed in the liquid processing unit 16A may not be particularly limited. By way of example, the chemical liquid processing may not be performed before the rinsing processing, and a dual-fluid cleaning processing may be performed instead, and the liquid processing performed in the liquid processing unit 16A may start from the rinsing processing.

Figure 5A:
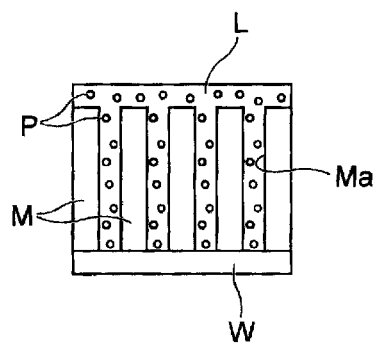
FIG. 5A is a schematic diagram illustrating a state in which a liquid film of a protection liquid is formed in a liquid film forming process of a substrate processing method according to the exemplary embodiment.

Subsequently, as a liquid film forming process, a liquid film of the protection liquid is formed on the surface of the wafer W. In this case, the protection liquid (for example, IPA) is supplied from the nozzle 162A onto the central portion on the surface of the wafer W. Accordingly, a replacement processing of replacing the rinse liquid existing on the surface of the wafer W (including the inside of a recess of the pattern formed on the surface of the wafer W) with the protection liquid is performed. At the final stage of the replacement processing (including a time period after the discharge of the protection liquid is stopped), the liquid film of the protection liquid (indicated by a notation L in FIG. 5A and FIG. 5B) is formed on the entire surface of the wafer W, as depicted in FIG. 5A. In this case, the recess (indicated by a notation Ma in FIG. 5A to FIG. 5E) of the pattern (indicated by a notation M in FIG. 5A to FIG. 5E) formed on the surface of the wafer W is filled with the protection liquid. When forming the liquid film of the protection liquid, by adjusting a rotation number of the wafer W or a supply amount of the protection liquid onto the wafer W, a thickness of the liquid film of the protection liquid (that is, a protection film) on the surface of the wafer W can be adjusted.

Further, in the liquid processing process and the liquid film forming process described above, all of the chemical liquid, the rinse liquid and the protection liquid may be supplied from the single nozzle 162A, or these processing liquids may be supplied from different nozzles individually.

Upon the completion of the liquid film forming process, as a transfer process, the wafer W with the liquid film of the protection liquid formed thereon is carried into the supercritical drying processing unit 16B from the liquid processing unit 16A. In this case, the wafer W is carried out from the liquid processing unit 16A, and then carried into the supercritical drying processing unit 16B by the substrate transfer device 17. In this carrying-in operation, the substrate transfer device 17 places the wafer W on the tray 161B taken out from the drying processing chamber 162B of the supercritical drying processing unit 16B. Thereafter, the tray 161B on which the wafer W is placed is accommodated in the drying processing chamber 162B, and the drying processing chamber 162B is air-tightly sealed.

Subsequently, as a drying process, the wafer W is dried by using a supercritical fluid, and the protection liquid is removed from the surface of the wafer W.

Figure 5B:
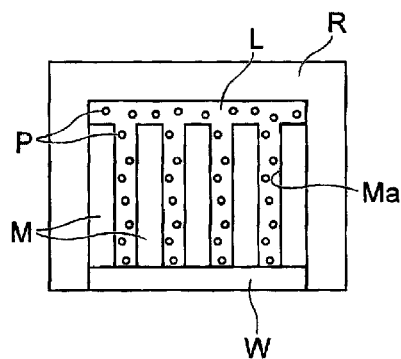
FIG. 5B is a schematic diagram illustrating a state in which the inside of a processing chamber is filled with a supercritical fluid in a wafer drying process of the substrate processing method according to the exemplary embodiment.

In this case, the opening/closing valve 25 provided at the supercritical fluid supply line 22 is opened, and the supercritical fluid (for example $CO_2$ in the supercritical state) is introduced into the drying processing chamber 162B from the supercritical fluid supply tank 24 at a predetermined flow rate by adjusting the degree of openness of the flow rate control valve 27. Accordingly, the pressure within the drying processing chamber 162B increases from the atmospheric pressure up to a pressure equal to or higher than a threshold pressure of the supercritical fluid, and, as shown in FIG. 5B, the inside of the drying processing chamber 162B is filled with the supercritical fluid in the supercritical state (as indicated by a notation R in FIG. 5B and FIG. 5C). At this time, the pressure controller 29 adjusts the degree of openness of the decompression valve 28 based on the pressure value measured by the pressure gauge 30, and the pressure within the drying processing chamber 162B is adjusted. The supercritical fluid comes into contact with the liquid film of the protection liquid formed on the surface of the wafer W, and the protection liquid is extracted into the supercritical fluid. At this time, the supercritical fluid also enters the recess of the pattern formed on the surface of the wafer W, and the protection liquid within the pattern is also extracted.

Figure 5C:
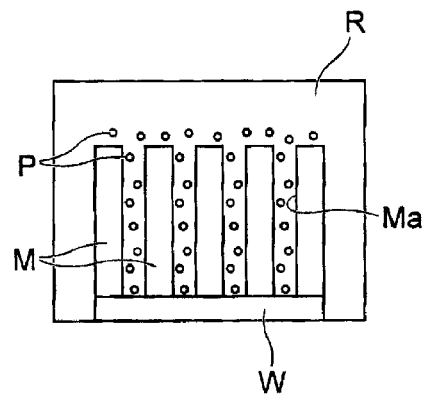
FIG. 5C is a schematic diagram illustrating a state in which the liquid film of the protection liquid is replaced by the supercritical fluid in the wafer drying process of the substrate processing method according to the exemplary embodiment.

A part of the supercritical fluid containing the protection liquid extracted in the drying processing chamber 162B is drained into the drain line 23. Meanwhile, a new supercritical fluid is continuously supplied into the drying processing chamber 162B from the supercritical fluid supply line 22. Accordingly, the removal of the protection liquid by the supercritical fluid within the drying processing chamber 162B is continued. In this way, as depicted in FIG. 5C, the protection liquid on the surface of the wafer W (including the inside of the recess of the pattern formed on the surface of the wafer W) is replaced by the supercritical fluid.

Figure 5D:
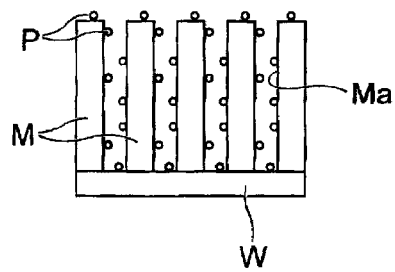
FIG. 5D is a schematic diagram illustrating a state in which a surface of a wafer is dried in the wafer drying process of the substrate processing method according to the exemplary embodiment.

After the protection liquid is replaced by the supercritical fluid, the drying processing chamber 162B is decompressed. In this case, the opening/closing valve 25 provided at the supercritical fluid supply line 22 is closed, and the degree of openness of the decompression valve 28 provided at the drain line 23 is increased. Further, the pressure within the drying processing chamber 162B is lowered to the atmospheric pressure. As a result, the supercritical fluid within the drying processing chamber 162B is turned into a gas state. Therefore, as shown in FIG. 5D, the surface of the wafer W can be dried without causing the pattern collapse.

Desirably, the protection liquid is a liquid which satisfies following conditions.

The protection liquid on the surface of the wafer W (including the inside of the recess of the pattern formed on the surface of the wafer W) is easily replaced by the supercritical fluid supplied onto the wafer W in the supercritical drying processing unit 16B.

The protection liquid is difficult to disappear easily by the volatilization thereof while the wafer W is being transferred from the liquid processing unit 16A into the supercritical drying processing unit 16B (if the pattern of the wafer W is exposed before the protection liquid is replaced by the supercritical fluid, the pattern may collapse due to a surface tension of the protection liquid).

In case that a process performed before supplying the protection liquid is the rinsing process, the rinse liquid (e.g., pure water) on the surface of the wafer W (including the inside of the recess of the pattern formed on the surface of the wafer W) needs to be easily replaced by the protection liquid.

In the present exemplary embodiment, though the IPA (Isopropyl Alcohol) is used as the protection liquid which satisfies all the above-mentioned requirements, the protection liquid is not particularly limited to the IPA as long as it meets the aforementioned requirements and does not have an adverse influence upon the wafer W. By way of example, alcohols such as 2-propanol, HFO (hydrofluoroolefin), HFC (hydrofluorocarbon), HFE (hydrofluoroether), simple substance of PFC (perfluorocarbon), and a mixture containing at least two compounds selected from the compound group in which IPA is added to these compounds may be used as the protection liquid.

Here, as depicted in FIG. 5D, though the protection liquid on the surface of the wafer W is removed after the drying process, the particles P may remain on the surface of the wafer W. Thus, in the present exemplary embodiment, a processing of removing these particles P is performed.

That is, after the drying process, a processing for removing the particles P left on the surface of the wafer W is performed as a particle removing process. Here, a processing of heating the wafer W is performed as the processing for removing the particles P. In the particle removing process according to the present exemplary embodiment, the wafer W subjected to the drying process is not carried out from the drying processing chamber 162B, and is kept accommodated within the drying processing chamber 162B.

In this case, the opening/closing valve 45 provided at the gas supply line 42 of the gas supplier 40 is first opened. Accordingly, the purge gas is supplied into the drying processing chamber 162B from the gas supply tank 43. The purge gas is heated in the gas heater 44 to be introduced into the drying processing chamber 162B as the high-temperature gas. The high-temperature gas introduced into the drying processing chamber 162B is exhausted through the drain line 23 from the drying processing chamber 162B.

Figure 5E:
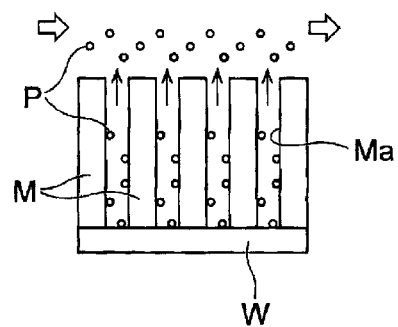
FIG. 5E is a schematic diagram illustrating a state in which particles are being removed from the surface of the wafer in a particle removing process of the substrate processing method according to the exemplary embodiment.

In the meanwhile, the wafer W accommodated in the drying processing chamber 162B is heated by the high-temperature gas, and the particles P remaining on the surface of the wafer W are also heated. Accordingly, the particles P on the wafer W are volatilized, as depicted in FIG. 5E. A component of the particles P volatilized from the surface of the wafer W is exhausted through the drain line 23 while being carried by the high-temperature gas as indicated by thick arrows in FIG. 5E.

Figure 5F:
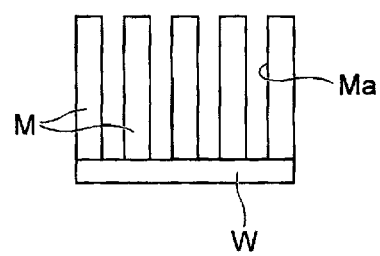
FIG. 5F is a schematic diagram illustrating a state in which the particles have been removed from the surface of the wafer in the particle removing process of the substrate processing method according to the exemplary embodiment.

By carrying on the supply of the high-temperature gas into the drying processing chamber 162B and the exhaust of this high-temperature gas from the drying processing chamber 162B, the particles P are removed from the surface of the wafer W (including the inside of the recess of the pattern formed on the surface of the wafer W), as shown in FIG. 5F.

Here, before the particle removing process and after the drying process, the particles P may remain on the surface of the wafer W as stated above. Many of these particles are volatile organic matters containing carbon as a component, and are contained in the protection liquid without having been removed through the filter 26 (see FIG. 4). Thus, it is deemed that the particles P are heated to be volatilized as the surface of the wafer W is heated. At this time, by setting the temperature of the wafer W to be higher than the temperature of the wafer W obtained in the drying process, the particles P left on the surface of the wafer W can be efficiently volatilized. By way of example, the temperature of the high-temperature gas supplied into the drying processing chamber 162B is equal to or higher than 80° C., and, desirably, equal to or higher than 100° C. In order to accelerate the removal of the particles P, it is advantageous that the temperature of the high-temperature gas is higher. However, a metal material forming the pattern may be deteriorated, so that the characteristic of the device formed by the pattern may be degraded. In view of this, it is desirable to set the temperature of the high-temperature gas to be equal to or less than the temperature at which the characteristic of the device is not deteriorated.

After the particle removing process, the tray 161B holding the wafer W is taken out from the drying processing chamber 162B, and the substrate transfer device 17 receives the taken wafer W from the tray 161B, and then transfers the wafer W to the delivery unit 14. This wafer W, on which the processing is completed, placed on the delivery unit 14 is returned back into the carrier C in the placing section 11 by the substrate transfer device 13.

According to the present exemplary embodiment as stated above, after the protection liquid is removed by drying the wafer W on which the liquid film of the protection liquid is formed, the wafer W is heated. As a result, the particles P remaining on the surface of the wafer W can be heated to be volatilized, and, thus, the particles P can be removed from the surface of the wafer W. Therefore, the particles P can be suppressed from being left on the surface of the wafer W.

Further, according to the present exemplary embodiment, the particles P remaining on the surface of the wafer W is removed in the state that the wafer W is accommodated in the drying processing chamber 162B of the supercritical drying processing unit 16B. Accordingly, since the particles P can be removed in the state that the wafer W is still accommodated in the drying processing chamber 162B after the drying process, the wafer W need not be transferred. Therefore, a reduction of a throughput in the substrate processing system 1 can be suppressed, so that the processing efficiency of the wafer W can be suppressed from being decreased. Further, since the removal of the particles P can be carried out within the drying processing chamber 162B, complication of the structure of the substrate processing system 1 can be avoided, so that an increase of an apparatus cost can be suppressed.

Furthermore, according to the present exemplary embodiment, the high-temperature gas is supplied into the drying processing chamber 162B. Since the wafer W can thus be heated by the high-temperature gas, the particles P remaining on the surface of the wafer W can be heated to be volatilized. Further, the high-temperature gas supplied into the drying processing chamber 162B is exhausted from the drying processing chamber 162B. Accordingly, the component of the particles P removed from the surface of the wafer W within the drying processing chamber 162B can be exhausted through the drain line 23 while being carried by the high-temperature gas. Therefore, the volatilized component of the particles P can be suppressed from being solidified and from adhering to the surface of the wafer W.

Moreover, according to the present exemplary embodiment, the temperature of the high-temperature gas supplied into the drying processing chamber 162B is higher than the temperature of the wafer W at a time when the wafer W is dried. Accordingly, the particles P remaining on the surface of the wafer W without being completely volatilized during the drying of the wafer W can be efficiently volatilized. Therefore, the particles P can be efficiently removed from the surface of the wafer W.

In addition, according to the present exemplary embodiment, the dry air or the inert gas is used as the high-temperature gas. If the dry air is used as the high-temperature gas, the high-temperature gas can be suppressed from containing moisture. Accordingly, the particles P remaining on the surface of the wafer W can be volatilized efficiently. Further, if the inert gas is used as the high-temperature gas, the high-temperature gas can be suppressed from containing moisture or oxygen. Therefore, the same as in the case of using the dry air, the particles P can be efficiently volatilized, and oxidation of the metal material forming the pattern formed on the surface of the wafer W can be suppressed, so that the deterioration of the characteristic of the device formed by the pattern can be suppressed.

Furthermore, the above exemplary embodiment has been described for the example where the supercritical drying processing unit 16B is used as the particle processing unit 16C and the particles P remaining on the surface of the wafer W are removed while being accommodated in the drying processing chamber 162B. However, the exemplary embodiment is not limited thereto, and the particle processing unit 16C is configured as a separate unit from the supercritical drying processing unit 16B. By way of example, the particle processing unit 16C may have a particle processing chamber 161C configured to accommodate the wafer W and be configured to remove the particles P remaining on the surface of the wafer W while accommodating the wafer W in the particle processing chamber 161C. In this case, within the particle processing unit 161C, the wafer W may be heated, an ultraviolet ray may be irradiated to the wafer W, or a gas cluster may be irradiated to the wafer W. It is desirable that the particle processing unit 16C is accommodated in the housing 3A of the processing station 3 shown in FIG. 3 and can be accessed by the wafer holding mechanism of the substrate transfer device 17.

Figure 6:
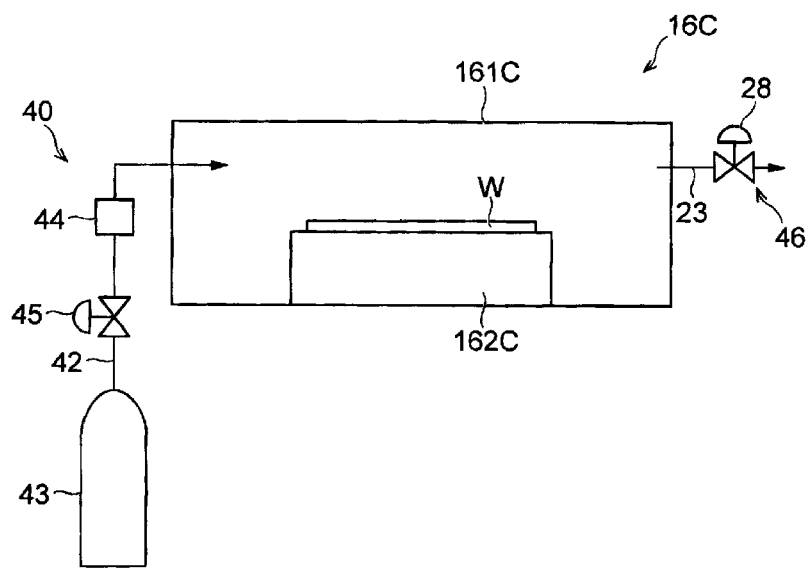
FIG. 6 is a schematic cross sectional view illustrating a particle processing unit in a substrate processing system according to a first modification example.

An example (first modification example) in which the wafer W is heated will be explained with reference to FIG. 6. In the example shown in FIG. 6, by supplying the high-temperature gas into the particle processing chamber 161C, the wafer W accommodated in the particle processing chamber 161C is heated. The particle processing chamber 161C shown in FIG. 6 is equipped with a wafer placing table 162C configured to place the wafer W thereon. Further, the gas supplier 40 and the gas exhaust device 46 having the same configurations as those of FIG. 4 are connected to the particle processing chamber 161C. Here, however, the gas supplier 40 and the gas exhaust device 46 shown in FIG. 6 may have different configurations from those of FIG. 4 as long as they can perform the supply/exhaust of the high-temperature gas into/from the particle processing chamber 161C.

In the example shown in FIG. 6, after the drying process, the substrate transfer device 17 receives the wafer W from the tray 161B taken out from the drying processing chamber 162B, and then transfers the wafer W into the particle processing chamber 161C. For example, though not illustrated, the particle processing chamber 161C may be provided with an opening, and the wafer W may be carried in through this opening. A shutter configured to be opened or closed may be provided at the opening. After carrying the wafer W into the particle processing chamber 161C through the opening, the substrate transfer device 17 places the wafer W on the wafer placing table 162C. The wafer placing table 162C may be provided with a holding mechanism configured to hold the wafer W mechanically or by vacuum attraction or the like.

Then, a processing for removing the particles P remaining on the surface of the wafer W is performed as the particle removing process. In the example shown in FIG. 6, the high-temperature gas is introduced into the particle processing chamber 161C from the gas supply line 42 of the gas supplier 40, and the high-temperature gas introduced into the particle processing chamber 161C is exhausted through the drain line 23. In the meanwhile, the wafer W accommodated in the particle processing chamber 161C is heated by the high-temperature gas, so that the particles P remaining on the surface of the wafer W are also heated. Accordingly, the particles P remaining on the surface of the wafer W are volatilized to be removed from the surface of the wafer W (including the inside of the recess of the pattern formed on the surface of the wafer W).

After the particle removing process, the substrate transfer device 17 takes out the wafer W from the particle processing chamber 161C, and then transfers the taken wafer W to the delivery unit 14.

Figure 7:
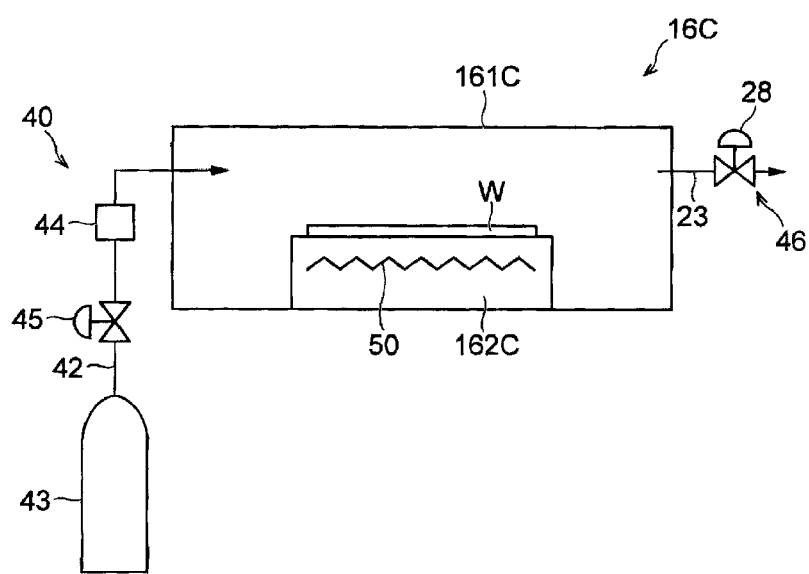
FIG. 7 is a schematic cross sectional view illustrating a particle processing unit in a substrate processing system according to a second modification example.

As another example (second modification example) in which the wafer W is heated, as shown in FIG. 7, a chamber heater 50 (chamber heating unit) configured to heat the wafer W may be provided in the particle processing chamber 161C configured as a separate unit from the supercritical drying processing unit 16B, and the inside of the particle processing chamber 161C may be heated by this chamber heater 50 to thereby heat the wafer W. With this configuration, the particles P remaining on the surface of the wafer W can be heated to be volatilized. By way of example, the chamber heater 50 may be embedded in the wafer placing table 162C as illustrated in FIG. 7.

In the example shown in FIG. 7, the gas supplier 40 and a gas exhaust device 46 are connected to the particle processing chamber 161C. Thus, the volatilized particles P can be exhausted through the drain line 23 while being carried by the purge gas, so that the component of the particles P can be suppressed from being solidified and from adhering to the surface of the wafer W. Further, since the particles P are heated by the chamber heater 50, the purge gas supplied from the gas supply tank 43 may not need to be heated. Thus, the purge gas may be set to be of the room temperature, and the gas supplier 40 shown in FIG. 7 may have a configuration in which the gas heater 44 is removed from the gas supply line 42 shown in FIG. 4. The same as in the gas supplier 40 shown in FIG. 4, however, the gas heater 44 may be provided, and the high-temperature gas prepared by heating the purge gas may be supplied into the particle processing chamber 161C. Further, the purge gas may be the dry air or the inert gas, the same as the high-temperature gas described in FIG. 4. The gas exhaust device 46 shown in FIG. 7 may have the same configuration as the gas exhaust device 46 illustrated in FIG. 4. Another configuration of the particle processing chamber 161C shown in FIG. 7 may be the same as the configuration of the particle processing chamber 161C shown in FIG. 6.

Further, if the supercritical drying processing unit 16B is configured to serve as the particle processing unit 16C, the chamber heater 50 illustrated in FIG. 7 may be provided in the drying processing chamber 162B of the supercritical drying processing unit 16B. In this case, the wafer W can be heated by heating the inside of the drying processing chamber 162B with this chamber heater. Accordingly, the particles P remaining on the surface of the wafer W can be heated to be volatilized. The gas supplier 40 in this configuration may have the same configuration as the gas supplier 40 shown in FIG. 7.

Figure 8:
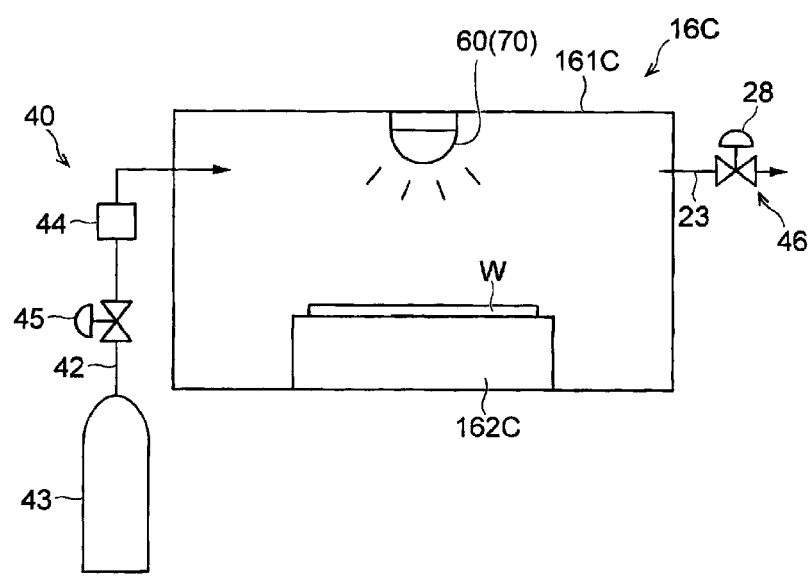
FIG. 8 is a schematic cross sectional view illustrating a particle processing unit in a substrate processing system according to a third exemplary embodiment.

As an example (third modification example) in which an ultraviolet ray is irradiated to the wafer W, as shown in FIG. 8, an ultraviolet lamp 60 (ultraviolet ray irradiator) configured to irradiate an ultraviolet ray to the surface of the wafer W may be provided within the particle processing chamber 161C configured as a separate unit from the supercritical drying processing unit 16B. In the example shown in FIG. 8, the ultraviolet lamp 60 is disposed above the wafer W which is placed on the wafer placing table 162C. Further, as in FIG. 7, the gas supplier 40 and the gas exhaust device 46 are connected to the particle processing chamber 161C. Furthermore, another configuration of the particle processing chamber 161C shown in FIG. 8 may be the same as the configuration of the particle processing chamber 161C shown in FIG. 6 and FIG. 7.

By irradiating the ultraviolet ray from the ultraviolet lamp 60 to the surface of the wafer W placed on the wafer placing table 162C, the ultraviolet ray can be irradiated to the particles P remaining on the surface of the wafer W. Accordingly, the particles P can be removed by being volatilized. That is, if the ultraviolet ray is irradiated to the volatile organic matters of the particles P, the organic matters are decomposed to be depolymerized. The depolymerized organic matters have the increased volatility. Therefore, the particles P remaining on the surface of the wafer W are more easily volatilized, so the particles P can be removed from the surface of the wafer W without heating them. The component of the particles P removed from the surface of the wafer W is exhausted through the drain line 23 while being carried by the purge gas. Accordingly, the volatilized component of the particles P can be suppressed from being solidified and from adhering to the surface of the wafer W. In the example shown in FIG. 8, since the wafer W is not heated, the degradation of the metal material forming the pattern on the surface of the wafer W can be suppressed, so that the deterioration of the characteristic of the device formed by the pattern can be suppressed.

Further, in the example shown in FIG. 8, the ultraviolet lamp 60 provided within the particle processing chamber 161C can be replaced with an infrared lamp 70 (infrared ray irradiator). This case is an example of removing the particles P by heating the wafer W. As an infrared ray is irradiated from the infrared lamp 70 to the surface of the wafer W placed on the wafer placing table 162C, the wafer W can be heated. Accordingly, the particles P remaining on the surface of the wafer W can be removed by being heated and volatilized.

Furthermore, in case that the supercritical drying processing unit 16B is configured to serve as the particle processing unit 16C, the ultraviolet lamp 60 or the infrared lamp 70 shown in FIG. 8 may be provided within the drying processing chamber 162B of the supercritical drying processing unit 16B. In this case as well, the particles P remaining on the surface of the wafer W can be removed as stated above. Further, in case that the ultraviolet lamp 60 or the infrared lamp 70 is provided within the drying processing chamber 162B, the gas supplier 40 may have the same configuration as the gas supplier 40 shown in FIG. 7 and FIG. 8.

An example (fourth modification example) in which a gas cluster is irradiated to the wafer W will be explained with reference to FIG. 9 to FIG. 11. In the example shown in FIG. 9, a nozzle unit 80 (gas cluster irradiator) configured to irradiate a gas cluster to the surface of the wafer W is provided within the particle processing chamber 161C configured as a separate unit from the supercritical drying processing unit 16B.

The nozzle unit 80 will be explained with reference to FIG. 9. In FIG. 9, the particle processing chamber 161C is configured as a vacuum vessel. A placing table 81 configured to place the wafer W horizontally thereon is disposed within the particle processing chamber 161C. Further, the particle processing chamber 161C is provided with a transfer port 82 and a gate valve 83 configured to open or close the transfer port 82.

By way of example, supporting pins (not shown) are provided at a bottom surface of the particle processing chamber 161C near the transfer port 82 to be inserted into through holes formed in the placing table 81. A non-illustrated elevating mechanism configured to move the supporting pins up and down is disposed under the placing table 81. The supporting pins and the elevating mechanism have a function of delivering the wafer W between a non-illustrated substrate transfer device and the placing table 81. One end of an exhaust path 84 through which an atmosphere within the particle processing chamber 161C is exhausted is connected to the bottom surface of the particle processing chamber 161C. The other end of the exhaust path 84 is connected to the vacuum pump 85. The exhaust path 84 is provided with a pressure controller 86 such as, but not limited to, a butterfly valve.

The placing table 81 is configured to be movable horizontally by a driving unit 87. The driving unit 87 is equipped with: an X-axis rail 87a horizontally extended on the bottom surface of the particle processing chamber 161C under the placing table 81; and a Y-axis rail 87b horizontally extended to be orthogonal to the X-axis rail 87a. The Y-axis rail 87b is extended from a closer side to transfer port 82 to a farther side from the transfer port 82 (left-right direction in FIG. 9). The X-axis rail 87a is extended in a direction perpendicular to the paper plane of FIG. 9. The X-axis rail 87a is configured to be movable along the Y-axis rail 87b. The aforementioned placing table 81 is disposed above this X-axis rail 87a with an elevating mechanism 88 therebetween. With this configuration, the placing table 81 is configured to be movable in the X-axis direction and the Y-axis direction by the driving unit 87, and be movable up and down by the elevating mechanism 88. Further, the placing table 81 is equipped with a non-illustrated temperature control mechanism configured to adjust a temperature of the wafer W placed on the placing table 81.

A protruding portion 89 projecting upwards is formed at a central portion of a ceiling surface of the particle processing chamber 161C. The nozzle unit 80 configured to irradiate the gas cluster is disposed at this protruding portion 89. A cleaning gas is supplied into the nozzle unit 80 from a region having a pressure higher than a pressure of the atmosphere within the particle processing chamber 161C. The nozzle unit 80 is configured to irradiate the supplied cleaning gas toward the wafer W within the particle processing chamber 161C to generate the gas cluster, which is an aggregation of atoms or molecules of the cleaning gas, by adiabatic expansion.

Figure 10:
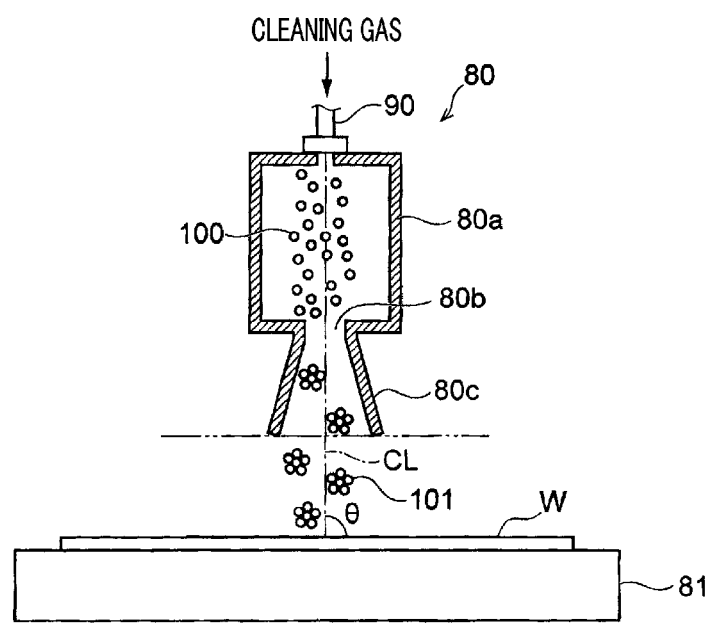
FIG. 10 is a diagram illustrating an example of a nozzle unit of the particle processing unit of FIG. 9.

The nozzle unit 80 includes a pressure chamber 80a having a substantially cylindrical shape, as depicted in FIG. 10. An orifice 80b is formed at a lower end of the pressure chamber 80a, and a gas diffuser 80c having a downwardly increasing diameter is connected to this orifice 80b.

The nozzle unit 80 is configured to irradiate the gas cluster vertically to the surface of the wafer W. Here, the term "vertical" implies a state where an angle formed between a central axis CL of a lengthwise direction (up-and-down direction) of the nozzle unit 80 and a placing surface of the placing table 81 (the surface of the wafer W) is within a range of 90°±15°, as shown in FIG. 10.

Figure 9:
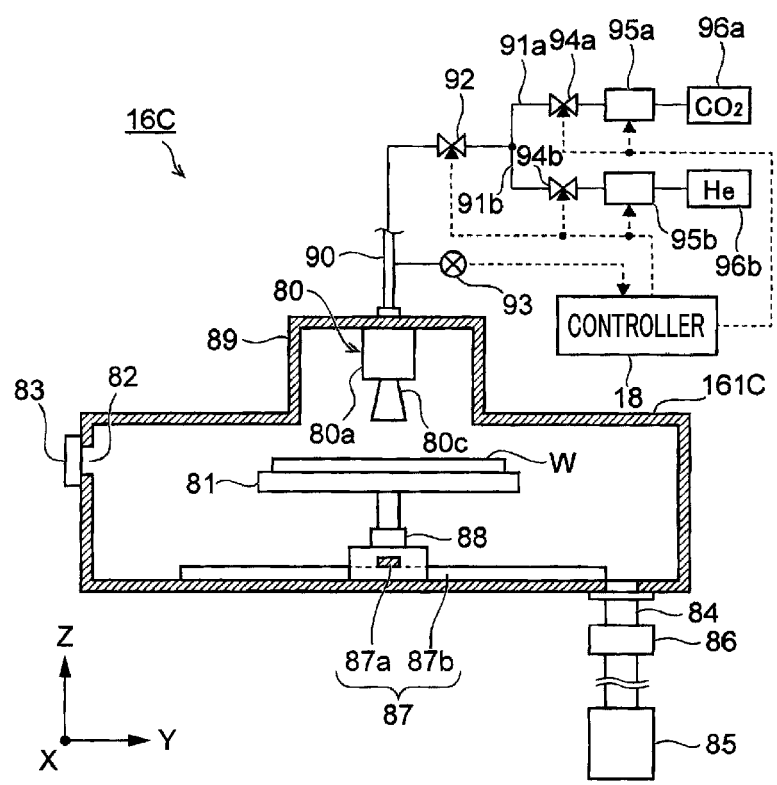
FIG. 9 is a schematic cross sectional view illustrating a particle processing unit in a substrate processing system according to a fourth exemplary embodiment.

As depicted in FIG. 9, one end of a gas supply path 90 is connected to an upper end of the pressure chamber 80a of the nozzle unit 80. The gas supply path 90 is extended upwards from the protruding portion 89 of the particle processing chamber 161C and is branched at a branch point into a first branch path 91a and a second branch path 91b. A pressure control valve 92 and a pressure detector 93 are provided between the branch point of the gas supply path 90 and the pressure chamber 80a. This pressure detector 93 is configured to detect a pressure within the gas supply path 90.

The first branch path 91a is provided with an opening/closing valve 94a and a flow rate controller 95a, and a $CO_2$ gas supply source 96a is connected to the other end of the first branch path 91a. The second branch path 91b is provided with an opening/closing valve 94b and a flow rate controller 95b, and a He gas supply source 96b is connected to the other end of the second branch path 91b.

A $CO_2$ (carbon dioxide) gas is the cleaning gas. As this cleaning gas is irradiated from the nozzle unit 80, the gas cluster is formed. With a He (helium) gas, it is difficult to form a gas cluster. However, by supplying this He gas to the nozzle unit 80, a partial pressure of the $CO_2$ gas within the particle processing chamber 161C can be lowered, as will be described later. Thus, using the He gas has an effect of hindering collision between the gas cluster and $CO_2$ gas molecules and an effect of improving a speed of the gas cluster generated from the $CO_2$ gas. The aforementioned controller 18 adjusts the degree of openness of the pressure control valve 92 based on the pressure value detected by the aforementioned pressure detector 93, so that the gas pressure within the pressure chamber 80a is controlled. The pressure detector 93 may be configured to detect the pressure within the pressure chamber 80a.

Further, the pressure adjustment based on the pressure value detected by the pressure detector 93 may be carried out by adjusting gas flow rates with a $CO_2$ gas flow rate controller 95a and a He gas flow rate controller 95b. Furthermore, the pressure adjustment may be carried out by increasing supply pressures, with a pressure increasing mechanism such as a gas booster, between the opening/closing valves 94a and 94b for the respective gases and the pressure control valve 92.

In the example shown in FIG. 9, the wafer W is carried into the particle processing chamber 161C of the particle processing unit 16C by the substrate transfer device, and then placed on the placing table 81 by the cooperation between the aforementioned non-illustrated supporting pins and the substrate transfer device. To elaborate, the wafer W transferred by the substrate transfer device 17 (see FIG. 1) is carried into a load lock chamber (not shown) configured to be switchable between an atmospheric pressure atmosphere and a vacuum atmosphere, and is then carried from this load lock chamber into the particle processing chamber 161C configured as the vacuum vessel by the non-illustrated substrate transfer device which is configured to transfer the wafer in the vacuum atmosphere. Then, positioning of the wafer W in the horizontal direction is performed by the driving unit 87, and the wafer W is moved such that an irradiation start position of the gas cluster on the surface of the wafer W is located directly under a gas cluster irradiation position of the nozzle unit 80. By way of example, the gas cluster irradiation position may be a periphery portion of the wafer W.

Thereafter, the gas cluster is generated by discharging a gas mixture of the $CO_2$ gas and the He gas with a flow rate ratio of 1:1 from the nozzle unit 80 toward the irradiation start position on the wafer W. In the nozzle unit 80, if the upstream of the orifice 80b is defined as a primary side and the downstream thereof is set as a secondary side, the supply pressure, which is a pressure at the primary side, of the nozzle unit 80 is desirably in the range from 0.5 MPa to 5.0 MPa and, more desirably, in the range from 0.9 MPa to 5.0 MPa. For example, the supply pressure at the primary side may be set to be 4 MPa. Further, the pressure of the processing atmosphere within the particle processing chamber 161C at the secondary side of the nozzle unit 80 is set to be 200 Pa at maximum.

The flow rates of the $CO_2$ gas and the He gas are adjusted to predetermined flow rates by the flow rate controllers 95a and 95b, and as the pressure control valve 92 and the opening/closing valves 94a and 94b are opened, the gas mixture of the $CO_2$ gas and the He gas are supplied into the nozzle unit 80. If the $CO_2$ gas is supplied into the processing atmosphere within the particle processing chamber 161C having the lower pressure from the nozzle unit 80 having the higher pressure, the $CO_2$ gas is cooled to a temperature equal to or less than a condensation temperature by rapid adiabatic expansion. As a result, as depicted in FIG. 10, molecules 100 are interconnected by the Van der Waals force, so that a gas cluster 101 as the aggregation of molecules 100 is generated.

Figure 11:
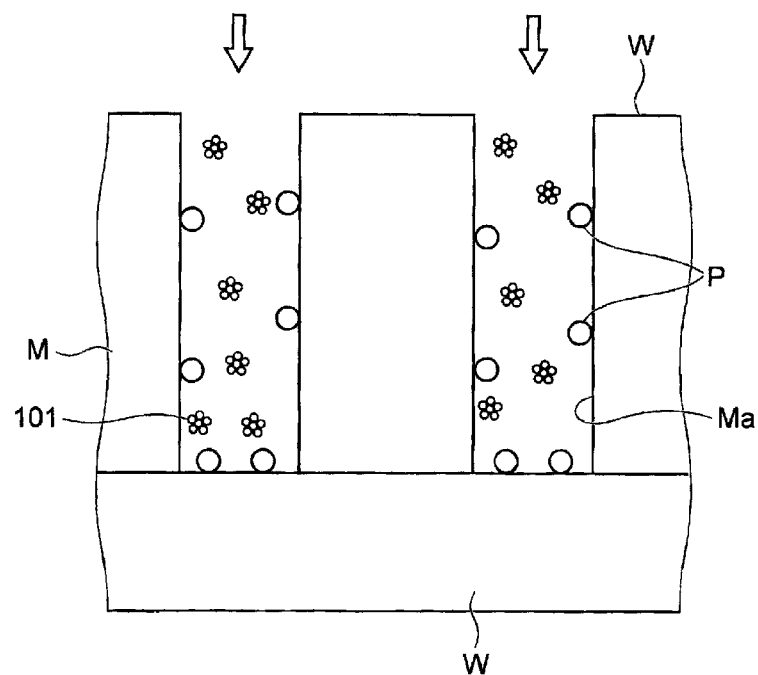
FIG. 11 is a schematic diagram illustrating a state in which particles are being removed from a surface of a wafer in the particle processing unit of FIG. 9.

The gas cluster 101 is vertically irradiated toward the wafer W from the nozzle unit 80 and introduced into the recess (indicated by a notation Ma in FIG. 11) of the pattern (indicated by a notation M in FIG. 11) formed on the surface of the wafer W, as illustrated in FIG. 11. Within the recess, a part of the gas cluster 101 collide with the particles P. The particle P are peeled off the wafer W (or the pattern on the wafer W) to be blown away by an impact of this collision. Further, even if the gas cluster 101 does not collide with the particles P directly, the particles P are peeled off the wafer W (or the pattern formed thereon) to be blown away by an impact generated when the gas cluster 101 collides with the wafer W. Then, the particles P are blown out of the recess to be removed toward the outside of the particle processing chamber 161C via the exhaust path 84.

Meanwhile, as the pattern on the wafer W is highly integrated, a size of a protrusion between adjacent recesses is getting smaller. Since, however, the gas cluster is irradiated vertically to the surface of the wafer W, a collapse of the protrusion, that is, a so-called pattern collapse is suppressed. Thereafter, by moving the placing table 81 horizontally while carrying on the irradiation of the gas cluster from the nozzle unit 80, the irradiation position of the gas cluster on the surface of the wafer W is moved sequentially. Accordingly, the gas cluster is irradiated to the entire surface of the wafer W, so that the particles P adhering to the entire surface of the wafer W are removed. Further, since the gas mixture of the $CO_2$ gas and the He gas are used as the cleaning gas supplied from the nozzle unit 80, kinetic energy of the gas cluster is increased, so that particle removing efficiency can be improved.

Furthermore, in case that the supercritical drying processing unit 16B is configured to serve as the particle processing unit 16C, the nozzle unit 80 (gas cluster irradiator) shown in FIG. 9 may be provided within the drying processing chamber 162B of the supercritical drying processing unit 16B. With this configuration as well, the particles P remaining on the surface of the wafer W can be removed as stated above. In this case, a gas supply path 90 which is the same as that of FIG. 9 may be connected to the drying processing chamber 162B.

Further, the particle processing unit 16C may be accommodated in a different substrate processing system which is provided separately from the substrate processing system 1 in which the supercritical drying processing unit 16B is accommodated. In this case, the wafer W is transferred into the particle processing unit 16C of this different substrate processing system after the drying process is performed on the wafer W in the supercritical drying processing unit 16B, and the particle removing process is performed therein.

Moreover, as the particle processing unit 16C in the fourth modification example, the one disclosed in Japanese Patent Laid-open Publication No. 2015-026745 according to a patent application filed by the present applicant may be used, for example, but not limited thereto.

The present disclosure is not limited to the above-described exemplary embodiments themselves and constituent elements can be modified and changed in an embodiment within the scope of the present disclosure. Further, the constituent elements described in the above exemplary embodiments can be combined appropriately to form various inventions. By way of example, some constituent elements may be removed from the constituent elements shown in the exemplary embodiment and the constituent elements in the different exemplary embodiments may be combined appropriately.

EXPERIMENTAL EXAMPLES

Experiments are conducted to investigate the particle removing efficiency by using the wafer W having the pattern formed thereon as a sample. Here, the experiments are performed on three experimental examples (experimental example 1 to experimental example 3). The experimental example 1 is an example where the chamber heater 50 in the second modification example shown in FIG. 7 is used; the experimental example 2, an example where the ultraviolet lamp 60 in the third modification example shown in FIG. 8 is used; and the experimental example 3, an example where the nozzle unit 80 (gas cluster irradiator) in the fourth modification example shown in FIG. 9 to FIG. 11 is used.

In the respective experimental examples, a number N1 of the particles remaining on the surface of the wafer W obtained after the drying process is performed by using a supercritical fluid is first measured. Then, the particle removing process is performed, and a number N2 of the particles remaining on the surface of the wafer W is measured. Then, the particle removing efficiency (=(N1−N2)/N1) is calculated from N1 and N2. The result is shown in FIG. 12.

Figure 12:
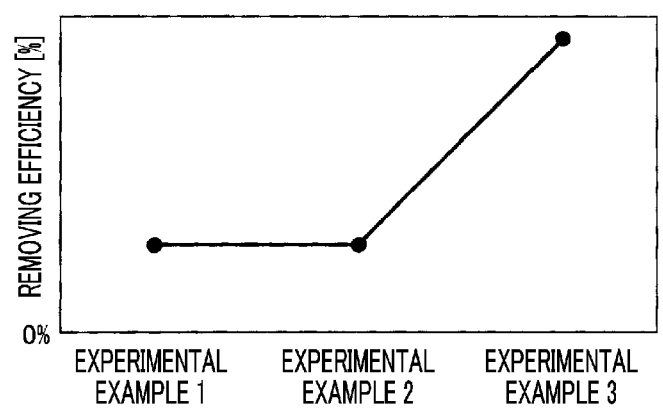
FIG. 12 is a graph showing particle removing efficiency in a sample A as an experimental example.

As can be seen from FIG. 12, the particle removing efficiency is found to be larger than 0% in all of the experimental examples 1 to 3, which means that the particles P can be efficiently removed from the surface of the wafer W by performing the particle removing process. In the experimental example 3, the particle removing efficiency is particularly increased, which means that the particles P can be removed from the surface of the wafer W more efficiently by irradiating the gas cluster 101 to the surface of the wafer W from the nozzle unit 80. Further, though the experimental examples of using the chamber heater 50, the ultraviolet lamp 60 and the nozzle unit 80 (gas cluster irradiator) are shown in FIG. 12, the particles P can still be efficiently removed even if other types of particle removing processes are performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
forming a liquid film of a protection liquid on a surface of a substrate;
drying, by using a supercritical fluid, the substrate to remove the protection liquid from the surface of the substrate; and
removing a particle remaining on the surface of the substrate after the drying of the substrate,
wherein while drying the substrate, the substrate is accommodated in a drying processing chamber,
after drying the substrate, the substrate is transferred into a particle processing chamber from the drying processing chamber, and
while removing the particle, the substrate is accommodated in the particle processing chamber, and a gas is supplied into the particle processing chamber from a region having a pressure higher than a pressure within the particle processing chamber such that a gas cluster is irradiated to the substrate.

2. The substrate processing method of claim 1,
wherein, while removing the particle, an ultraviolet ray is irradiated to the substrate.

3. The substrate processing method of claim 1,
wherein, while removing the particle, a high-temperature gas is supplied into the particle processing chamber, and the high-temperature gas is then exhausted from the particle processing chamber.

4. The substrate processing method of claim 3,
wherein a temperature of the high-temperature gas is higher than a temperature of the substrate obtained while drying the substrate.

5. The substrate processing method of claim 1,
wherein while removing the particle, an infrared ray is irradiated to the substrate.

6. A computer-readable recording medium having stored thereon computer-executable instructions that, in response to execution, cause a substrate processing apparatus to perform a substrate processing method as claimed in claim 1.

7. A substrate processing apparatus, comprising:
a liquid film forming device configured to form a liquid film of a protection liquid on a surface of a substrate;
a drying processing device configured to dry the substrate accommodated in a drying processing chamber by using a supercritical fluid to remove the protection liquid from the surface of the substrate;
a particle processing device configured to remove a particle remaining on the surface of the substrate accommodated in a particle processing chamber; and
a controller configured to:
control the drying processing device to dry the substrate when the substrate is accommodated in the drying processing chamber;
after the substrate is dried in the drying processing chamber, control a transfer device to transfer the substrate into the particle processing chamber from the drying processing chamber; and
control the particle processing device to remove the particle remaining on the surface of the substrate when the substrate is accommodated in the particle processing chamber, by irradiating a gas cluster to the substrate by supplying a gas into the particle processing chamber from a region having a pressure higher than a pressure within the particle processing chamber.

8. The substrate processing apparatus of claim 7,
wherein the particle processing device removes the particle by irradiating an ultraviolet ray to the substrate.

9. The substrate processing apparatus of claim 7,
wherein the drying processing device comprises a gas supplier configured to supply a high-temperature gas into the drying processing chamber; and a gas exhaust device configured to exhaust the high-temperature gas from the drying processing chamber.

10. The substrate processing apparatus of claim 7,
wherein the particle processing device is configured as a separate device from the drying processing device.

11. The substrate processing apparatus of claim 10,
wherein the particle processing device comprises a gas supplier configured to supply a high-temperature gas into the particle processing chamber; and a gas exhaust device configured to exhaust the high-temperature gas from the particle processing chamber.

12. The substrate processing apparatus of claim 10,
wherein the particle processing device comprises an ultraviolet ray irradiator provided in the particle processing chamber and configured to irradiate an ultraviolet ray to the substrate.

13. The substrate processing apparatus of claim 10,
wherein the particle processing device comprises an infrared ray irradiator provided in the particle processing chamber and configured to irradiate an infrared ray to the substrate.

14. The substrate processing apparatus of claim 10,
wherein the particle processing device comprises a gas cluster irradiator provided in the particle processing chamber and configured to irradiate the gas cluster to the substrate.

* * * * *